(12) United States Patent
Lee

(10) Patent No.: US 6,661,735 B2
(45) Date of Patent: Dec. 9, 2003

(54) SEMICONDUCTOR MEMORY DEVICE

(75) Inventor: Jae Jin Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/025,100

(22) Filed: Dec. 18, 2001

(65) Prior Publication Data

US 2003/0112696 A1 Jun. 19, 2003

(30) Foreign Application Priority Data

Dec. 18, 2001 (KR) .......................................... 2000-77699

(51) Int. Cl.[7] ................................................ G11C 8/00
(52) U.S. Cl. ........................ 365/233; 365/191; 365/201
(58) Field of Search .................................. 365/233, 196, 365/191, 230.08, 189.05, 201

(56) References Cited

U.S. PATENT DOCUMENTS

| 5,444,667 A | * | 8/1995 | Obara ........................ 365/233 |
| 5,701,273 A | * | 12/1997 | Choi ...................... 365/230.08 |
| 5,815,462 A | * | 9/1998 | Konishi et al. .............. 365/233 |
| 6,292,428 B1 | * | 9/2001 | Tomita et al. ............... 365/233 |
| 6,295,238 B1 | * | 9/2001 | Tanizaki et al. ............. 365/201 |
| 6,320,819 B2 | * | 11/2001 | Tomita et al. ............... 365/233 |
| 6,385,100 B2 | * | 5/2002 | Noda et al. ............. 365/189.12 |
| 2002/0066058 A1 | * | 5/2002 | Sugamoto et al. .......... 714/724 |

FOREIGN PATENT DOCUMENTS

| JP | 11297097 | 10/1999 |
| JP | 11306797 | 11/1999 |

OTHER PUBLICATIONS

U.K. Search Report dated Jul. 24, 2002, 2 pages.

* cited by examiner

*Primary Examiner*—Gene Auduong
(74) *Attorney, Agent, or Firm*—Marshall, Gerstein & Borun LLP

(57) ABSTRACT

An improved semiconductor memory device able to detect problems that appear in a high-speed circuit operation is disclosed. The device may include a data input/output operation by making an internal clock signal be a high frequency signal synchronized with an external clock signal at its rising and falling edges, which results in performing a high-speed test operation in a wafer level.

18 Claims, 13 Drawing Sheets

SEMICONDUCTOR MEMORY DEVICE

TECHNICAL FIELD

A semiconductor memory device is disclosed. More particularly, an improved semiconductor memory device is disclosed which can generate an internal clock signal synchronized with an external clock signal at rising and falling edges of the external clock signal to thereby perform a high frequency test operation on a wafer level of the device. The problems caused by a high-speed data input/output operations can be exactly detected during a test operation on the wafer level of the device.

BACKGROUND

Typically, in a wafer level, a semiconductor memory device fabricated through a unit process is put into a test operation of a wafer level to check the device for defects over its memory cell array regions. If a defective cell is found, it is repaired with a spare memory cell provided in the device. In addition to the wafer level test, the semiconductor memory device encapsulated by a package process, which takes place after the fabrication steps at the wafer level, is further inspected for the detects in package level testing. Devices that pass both levels of testing are referred to as verified devices that are considered to be complete memory device chips that are salable.

During a test operation in the package level, a high frequency test can be performed because of a short distance of interface for communicating between test equipment and a semiconductor memory device. However, because interface conditions in a wafer level are not as satisfactorily convenient as those of the package level, it is difficult to conduct a high frequency test operation that substantially coincides with clock signals controlling the test operation. Such mal-coincidence between the test clock signals and the interface performance for test causes propagation skew of operation times as well as a limit for the high frequency test operation. Accordingly, there is a functional limit for the test operations that may be performed at the wafer level because only a basic checkout operation for defects of memory cells can be performed. High frequency test operation is not practical at the wafer level.

Due to the functional limitations involved in the high frequency test operation at the wafer level, a defect not detected during the wafer level test, that is, in a low frequency operation test, is occasionally found in the package level test. In the worst case, the defect may prevent the memory device from being sold, thereby degrading yield.

A practical instance relevant to the aforementioned problems may be illustrated in a synchronous dynamic random access memory (SDRAM). Though SDRAM is usually operated at a frequency of 30 megahertz (MHz) to 60 MHz in a test mode, it is possible for the SDRAM to be used in practical operation at a frequency of more than 100 MHz in a memory system.

The SDRAM reads and writes data at every clock cycle, and thereafter is precharged. Here, if an internal clock signal is provided therein with a low frequency, a normal precharge operation can be carried out with good performance because of a long clock cycle time. On the other hand, if an internal clock signal is introduced therein with a high frequency, a mal-operation may occur in sense amplifiers or memory cells due to the short period of the high frequency clock signal.

Such problems arise because the high frequency test operation cannot harmonize with an internal clock signal made by an internal clock generator receiving an external clock signal having the same frequency as that of the internal clock signal.

Referring to FIG. 1, an internal clock generator 10 includes a clock conversion circuit 12, a buffer 14 transmitting an external clock signal XCLK to the clock conversion circuit 12, and a buffer 16 generating an internal clock signal by inverting and amplifying an output of the clock conversion circuit 12.

The internal clock generator 10 is designed to generate an internal clock signal having a phase or duty cycle that is converted without changing of frequency of the external clock signal XCLK. The internal clock signal generated by the internal clock generator 10 is provided to each element, e.g., a command input buffer 18, requiring the internal clock signal.

In response to the internal clock signal having the same frequency as that of the external clock signal XCLK, the command input buffer 18 buffers a command signal such as a row address strobe signal (RAS) provided from an external source, and then provides the buffered command signal to a command decoder 20. The command decoder 20 decodes a plurality command signals, and generates an active signal ATV.

As described above, in the conventional semiconductor memory device, command signals are buffered or decoded by an internal clock signal having the same frequency with that of the external clock signal XCLK. As a result, the conventional semiconductor memory device is not able to operate properly with the high frequency condition in a wafer level test, and testing at the wafer level is confined to a low frequency test operation.

That is, in the conventional semiconductor memory device, defects of memory cells themselves can be detected, but defects associated with high frequencies such as problems in data input/output performance cannot be found through the wafer level test. Therefore, conventional semiconductor memory devices may have many defects involved in characteristics of the high-speed operation in the package level test that were not found at wafer level testing, which results in yield degradation.

SUMMARY

A semiconductor memory device according to this disclosure may process internal command signals, addresses, and data input/output by using an internal clock signal is constructed to generate an internal clock signal synchronized with the external clock signal at its rising and falling edges, resulting in performing a high-speed operation. To this end, a clock generator may include a logic combination circuit for providing a non-inverted and an inverted external clock signal as a first signal and a second signal, respectively, in a test mode. The clock generator may also include a first clock generator for generating a first clock signal synchronized with the external clock signal at its rising edges as the first signal, a second clock generator for generating a second clock signal synchronized with the external clock signal at its falling edges as the second signal, and a logic combination circuit for generating an internal clock signal by receiving the first and the second clock signals. Therefore, in a test mode, the internal clock signal is synchronized with the external clock signal at its rising and the falling edges, and is generated to have a frequency higher than that of the external clock signal, using the internal clock signal to perform a high frequency wafer level test.

The semiconductor memory device may further include a first frequency divider for dividing the internal clock signal into a first divided clock signal synchronized with the external clock signal at its rising edges, and a second frequency divider for dividing the internal clock signal into a second divided clock signal synchronized with the external clock signal at its falling edges.

A data input buffer may include a first switch circuit for temporarily storing an inputted data in response to the first divided clock signal, a second switch circuit for switching the data temporarily stored in the first switch circuit in response to the second divided clock signal, and a latch circuit for receiving the data provided from the first and the second switch circuits, and for temporarily storing the data.

A data output buffer may include a third switch circuit for switching a data that is provided in response to the first divided clock signal, a first output circuit for temporarily storing the data in response to the second divided clock signal, a second output circuit for temporarily storing an output from the third switch circuit and the first output circuit, and a driving circuit for generating data from an output of the second output circuit.

DETAILED DESCRIPTION

The disclosed apparatus, when a test mode signal is applied in a wafer level, generates an internal clock signal having a high frequency that is synchronized with the external clock signal at its rising and falling edges in response to the applied test mode signal, so that the internal clock signal is provided to a command input buffer or an internal address generator, or any other suitable device.

The disclosed apparatus converts the internal clock signal into a clock signal synchronized with the external clock signal at its rising and falling edges, so that the clock signals are provided to the data input or output buffer.

Figure 1:
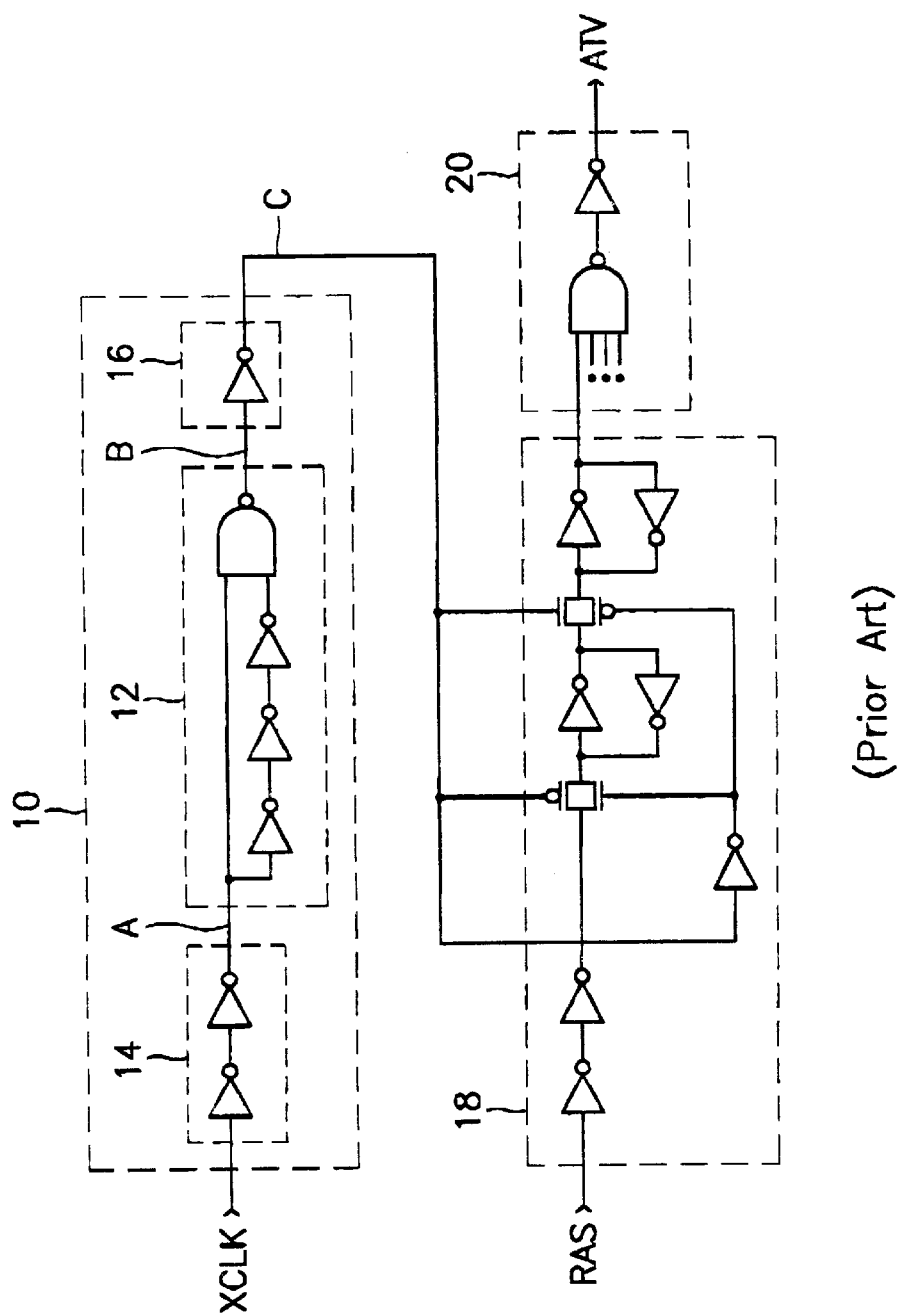
FIG. 1 is a circuit diagram illustrating a conventional internal clock generator.
Figure 2:
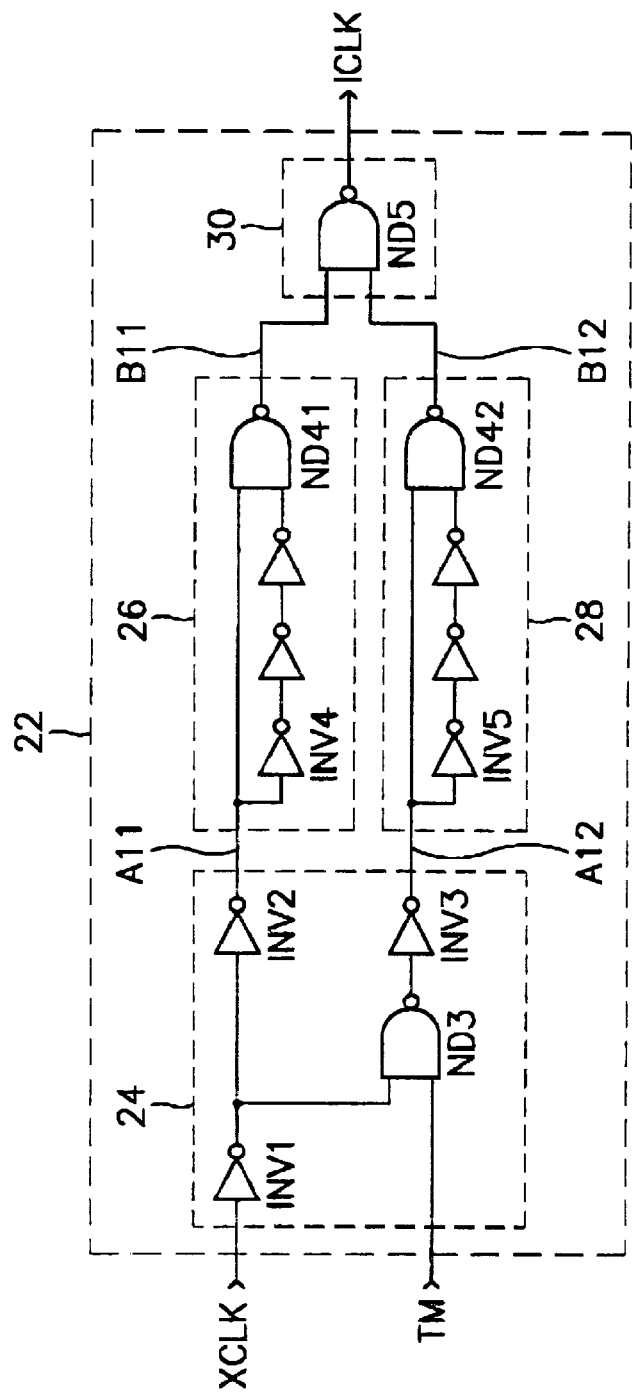
FIG. 2 is a circuit diagram illustrating a semiconductor memory device in accordance with the present disclosure.

FIG. 2 shows an embodiment of a clock generator for generating an internal clock signal synchronized with the external clock signal at its falling and rising edges.

A clock generator 22 includes a logic combination circuit 24 for receiving an external clock signal XCLK and a test mode signal TM, and for providing signals A11 and A12 that are non-inverted and inverted signals from the external clock signal, respectively. The test mode signal TM may be inputted through a connection pad (not shown) of a wafer, or may be generated from the clock generator itself to perform a test operation.

The logic combination circuit 24 includes a first path composed of inverters INV1 and INV2 connected with each other in series which generate a non-inverted external clock signal XCLK, a NAND gate ND3 receiving an output of the inverter INV1 and the test mode signal TM, and a second path inverting an output of the NAND gate ND3 through an inverter INV3. The signal A11 is provided through the first path, and the signal A12 is provided through the second path.

Therefore, when the test mode signal TM is in or at a low level, the logic combination circuit 24 provides the signal A11 from the external clock signal XCLK in a non-inverted state, and provides the signal A12 maintaining a low level regardless of states of the external clock signal XCLK. On the contrary, when the test mode signal TM is a high level, the logic combination circuit 24 provides the signal A11 from the external clock signal XCLK in a non-inverted state, and provides the signal A12 from the external clock signal XCLK in an inverted state. The signal A11 generated from the logic combination circuit 24 is provided to a clock generator 26, and the signal A12 is provided to a clock generator 28.

The clock generator 26 provides the inputted signal A11 to an inverter INV4 including inverters of odd numbers connected with each other in series, supplies the signal A11 which is undelayed and delayed by the inverter INV4 to a NAND gate ND41, and generates a signal B11 from the signal A11 through the NAND gate ND41. The clock generator 28 provides the inputted signal A12 to an inverter INV5 including inverters of odd numbers connected with each other in series, supplies the signal A12 which is undelayed and delayed by the inverter INV5 to a NAND gate ND42, and generates a signal B12 from the signal A12 through the NAND gate 42.

If the test mode signal TM is input as a high-level signal, the clock generator 26 generates the pulse signal B11 having a same frequency with that of the external clock signal XCLK in synchronism with the external clock signal XCLK at its rising edges. Further, the clock generator 28 generates the pulse signal B12 having the same frequency with that of the external clock signal XCLK in synchronism with the external clock signal XCLK at its falling edges.

On the other hand, if the test mode signal TM is input as a low-level signal, the clock generator 26 generates the pulse signal B11 having the same frequency as that of the external clock signal XCLK in synchronism with the external clock signal XCLK at its rising edges. The clock generator 28 generates the pulse signal B12 maintaining a low level regardless of states of the external clock signal XCLK.

The signal B11 generated from the clock generator 26 and the signal B12 generated from the clock generator 28 are provided to a NAND gate ND5. As a result, the NAND gate ND5, in case that a high-leveled test mode signal is applied to therein, generates an internal clock signal ICLK having a high frequency synthesizing the clock signals synchronized with the external clock signal XCLK at its falling edges and with the external clock signal XCLK at its rising edges. On the contrary, the NAND gate ND5, in case that a low-leveled test mode signal TM is applied to therein, generates the internal clock signal ICLK having the same frequency with that of the external clock signal XCLK in synchronism with the external clock signal XCLK at its rising edges.

Figure 3:
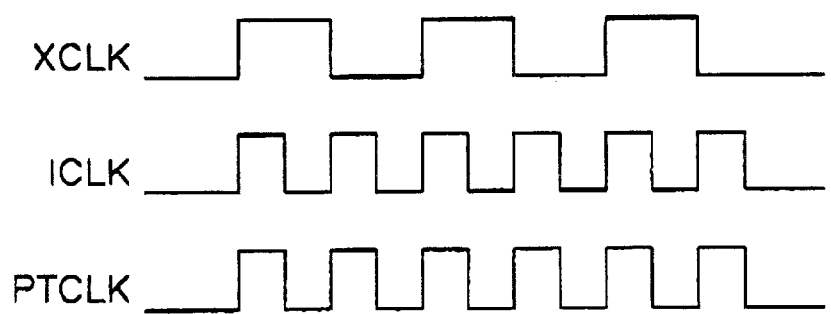
FIG. 3 is a timing diagram illustrating clock signals for a high-frequency test operation in accordance with the circuit of FIG. 2.

In a test mode operation, the internal clock signal ICLK, as shown in FIG. 3, has a waveform of signal synthesizing the clock signal with synchronized with the external clock signal XCLK at its rising edges and the clock signal synchronized with the external clock signal XCLK at its falling edges. The internal clock signal ICLK may have a frequency and a waveform that are similar to those of a package test clock signal PTCLK for performing a high frequency test operation in a package level.

The internal clock signal ICLK generated in accordance with the above embodiment is provided to each element such as the command input buffer or the internal address generator, and has a frequency twice higher than that of the external clock signal XCLK in the test mode operation.

Therefore, in a wafer level, the high frequency test operation can be performed in accordance with an established state of the test mode signal TM.

Figure 4:
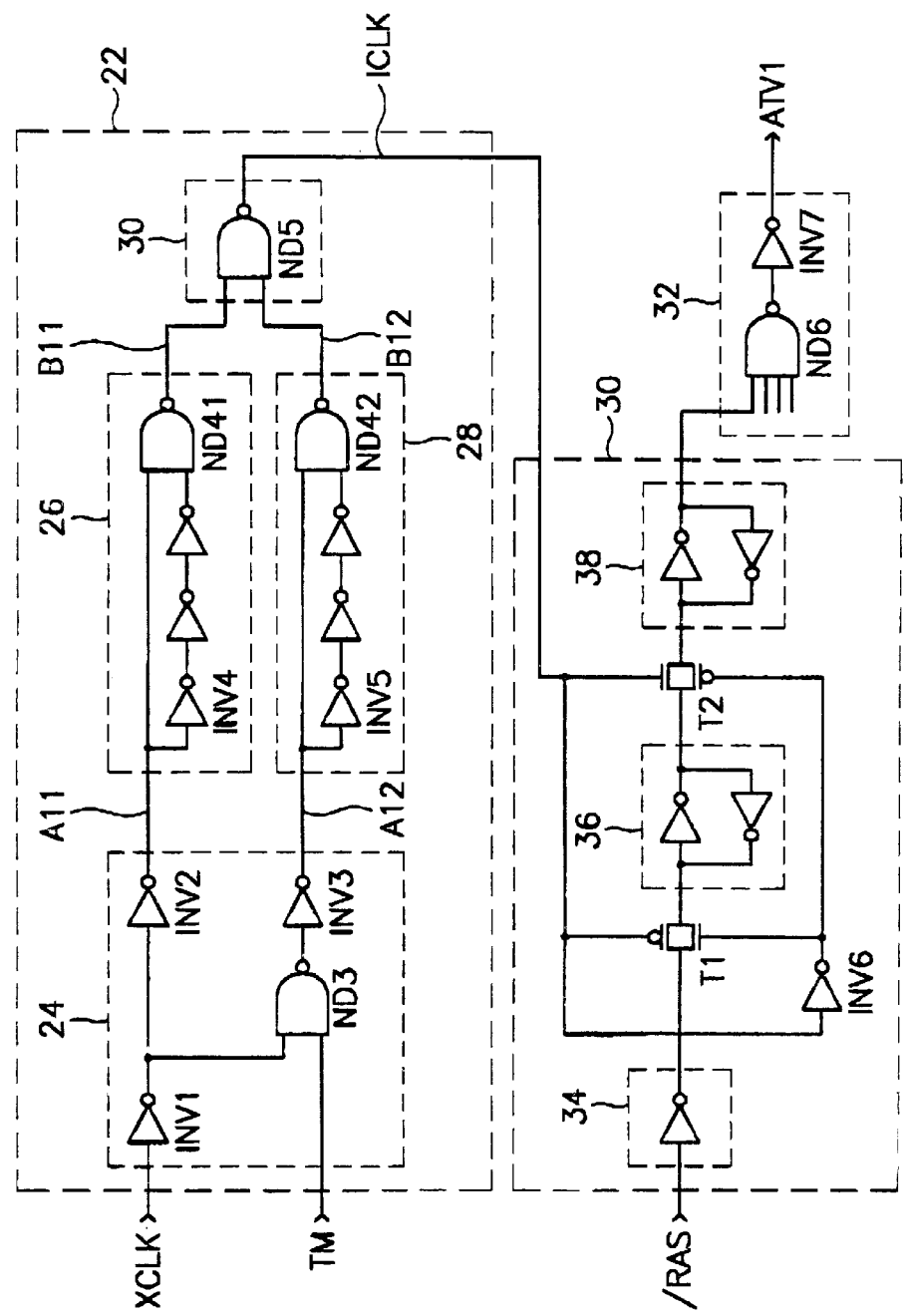
FIG. 4 is a circuit diagram illustrating an example of a command input buffer.

An example relevant to the embodiment can be applied to a command input buffer as shown in FIG. 4.

In a clock generator 22 having a similar construction to the embodiment of FIG. 2, the internal clock signal ICLK is provided to a command input buffer 30 which inverts an external row address strobe signal/RAS to an internal row address strobe signal, and supplies to a command decoder 32. The command decoder 32 receives a plurality of command signals including the internal row address strobe signal and the internal column address strobe signal, and generates an active signal ATV1.

The command input buffer 30 for inverting the external row address strobe signal/RAS includes an input buffer 34 formed of an inverter, a latch 36, and an output latch 38. Further, there is a switch T1 between the input buffer 34 and the latch 36, and the T1 is switched by an inverted and/or non-inverted internal clock signal ICLK. Also, there is a switch T2 between the latch 36 and the output latch 38, and the T2 is switched by an inverted and/or non-inverted internal clock signal ICLK.

As a result, the external row address strobe signal/RAS is applied to the switch T1 in an inverted state through the input buffer 34. By operating the switches T1 and T2, an output of the input buffer 34 is temporarily stored in the latch 36, and the signal temporarily stored in the latch 36 is provided to the command decoder 32 as the internal row address strobe signal through the output latch 38. The command decoder 32 synthesizes a plurality of command signals including the internal row address strobe signal, and generates the active signal ATV1.

Figure 5:
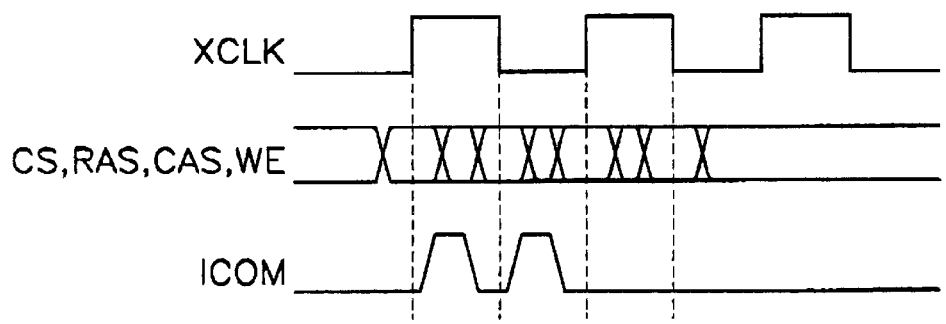
FIG. 5 is a timing diagram of signals generated in accordance with the embodiment of FIG. 4.

In the above operation, because the internal clock signal ICLK has a frequency twice that of the external clock signal XCLK as shown in FIG. 5, internal command signals including the internal row address strobe signal have a frequency twice as high as before, so that a command signal such the active signal ATV1 (i.e., ICOM of FIG. 5) may have double frequency.

Because in the wafer level test, the clock generator 22 can generate a high frequency clock signal as the external clock signal XCLK without supplying the clock signal from an external source, it is possible for the test for characteristics of the high-speed operation to be performed in the wafer level.

Figure 6:
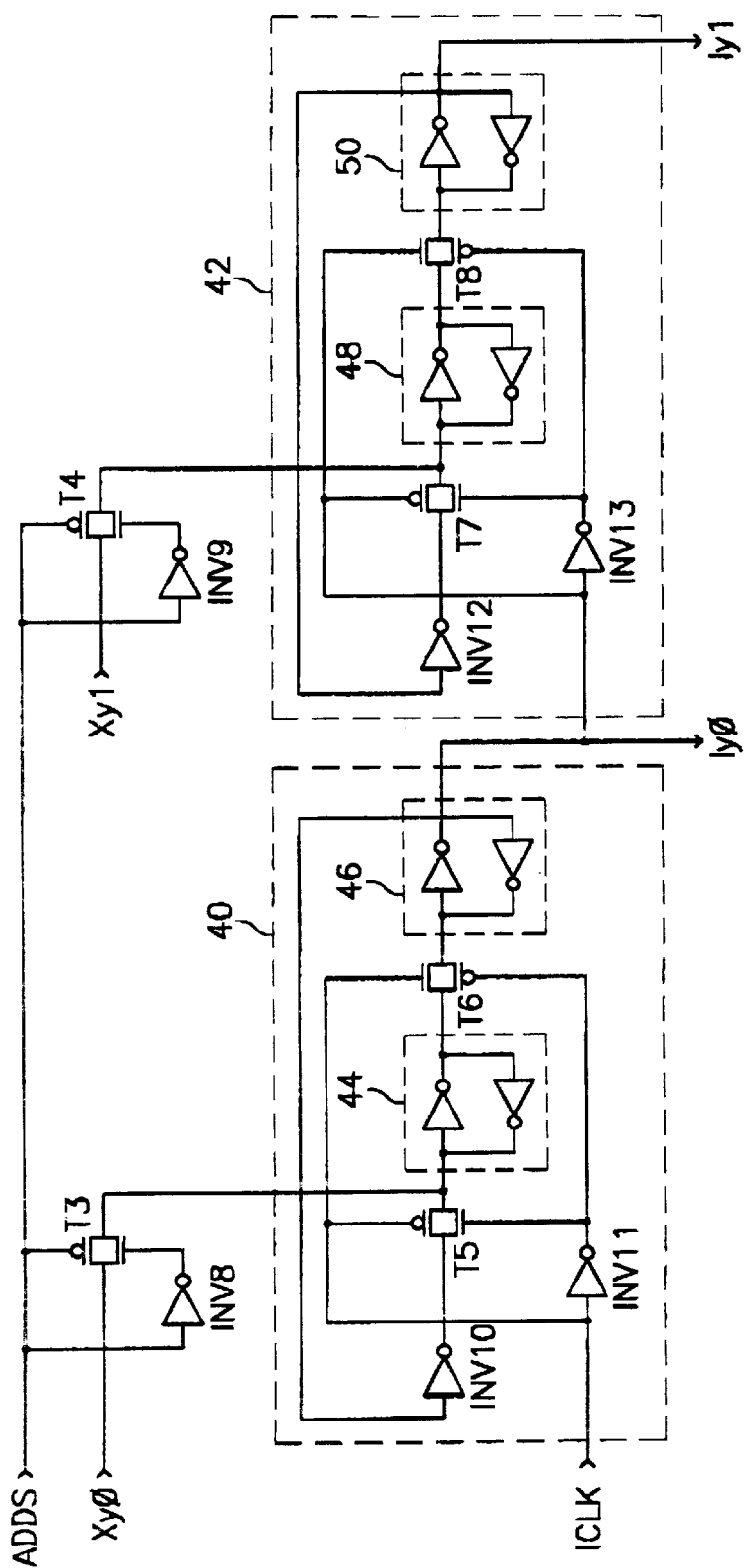
FIG. 6 is a circuit diagram illustrating an embodiment of an internal address generator.

Further, the internal clock signal ICLK is provided to an internal address generator as shown in FIG. 6, and thereby the high-speed test operation can be performed in the wafer level without an additional high frequency clock signal for a high frequency operation from an external source.

Referring to FIG. 6, the internal address generator supplies internal address signals Iy0 and Iy1 in response to the internal clock signal ICLK, external address signals Xy0 and Xy1, and an address set signal ADDS.

In order to perform the high-speed test operation in the wafer level, the internal clock signal ICLK is provided to have a frequency twice that of the external clock signal XCLK by the clock generator 22 of FIG. 2, and the address set signal ADDS is inverted in an address buffer (not shown) by the internal clock signal ICLK having the frequency twice higher than that of the external clock signal XCLK.

Specifically, the internal address generator includes a first address generator 40 and a second address generator 42, where the first address generator 40 receives the external address signal Xy0 through a switch T3, and the second address generator 42 receives the external address signal Xy1 through a switch T4. The switches T3 and T4 operates in response to a non-inverted address set signal ADDS and an address set signal ADDS inverted by inverters INV8 and INV9.

With respect to a construction of the first address generator 40, the internal clock signal ICLK is applied to switches T5 and T6 in a non-inverted state and in a state inverted by an inverter INV11. A latch 44 is connected between the switches T5 and T6, and an output latch 46 receiving an output of the T6 generates the internal address signal Iy0 that is fed back to the switch T5 through an inverter INV10. The external address signal Xy0 switched by the switch T3 is applied to a path between the switch T5 and the latch 44. An output of the output latch 46 is applied to the second address generator 42.

The second address generator 42 having the same configuration as the first address generator 40 allows an output of the first address generator 40, i.e., internal address signal Iy0 to be applied to switches T7 and T8 in states non-inverted and inverted by an inverter INV13. A latch 48 is connected between the switches T7 and T8, and an output latch 50 receiving an output of the switch T8 generates the internal address signal Iy1 that is fed back to the switch T7 through an inverter INV12. The external address signal Xy1 switched by the switch T4 is applied to a path between the switch T7 and the latch 48.

Figure 7:
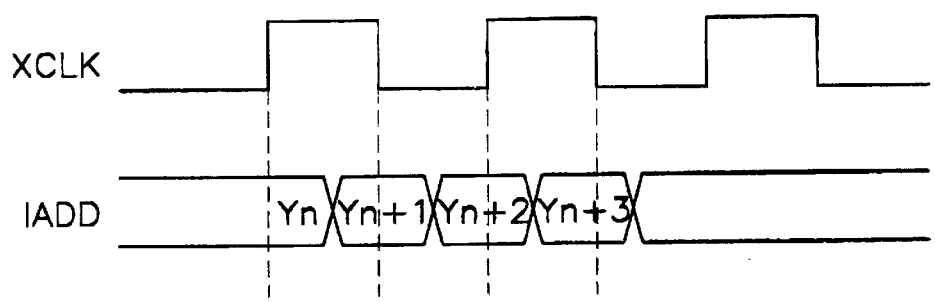
FIG. 7 is a timing diagram of signals generated in accordance with the embodiment of FIG. 6.

As described above, the internal address generator operates in response to the internal clock signal ICLK having a frequency twice that of the external clock signal XCLK of FIG. 7. In this case, the address set signal ADDS switching the external address signal Xy0 and Xy1 is also provided in an inverted state by the internal clock signal ICLK. Therefore, the internal address generator of FIG. 6 provides an internal address IADD combined the internal address signals Iy0 and Iy1 having a frequency twice higher than that of the external clock signal XCLK as shown in FIG. 7.

Meanwhile, in order to perform the high frequency wafer level test, the internal clock signal ICLK having a frequency twice that of the external clock signal XCLK can be applied without any transform to the command input buffer or the internal address generator. However, a data input buffer and a data output buffer can be operable to be tested by a clock signal synchronized with the external clock signal XCLK at its rising edges and by a clock signal synchronized with the external clock signal XCLK at its falling edges. For this performance, the clock generator 22 can be modified as shown in FIG. 8.

Figure 8:
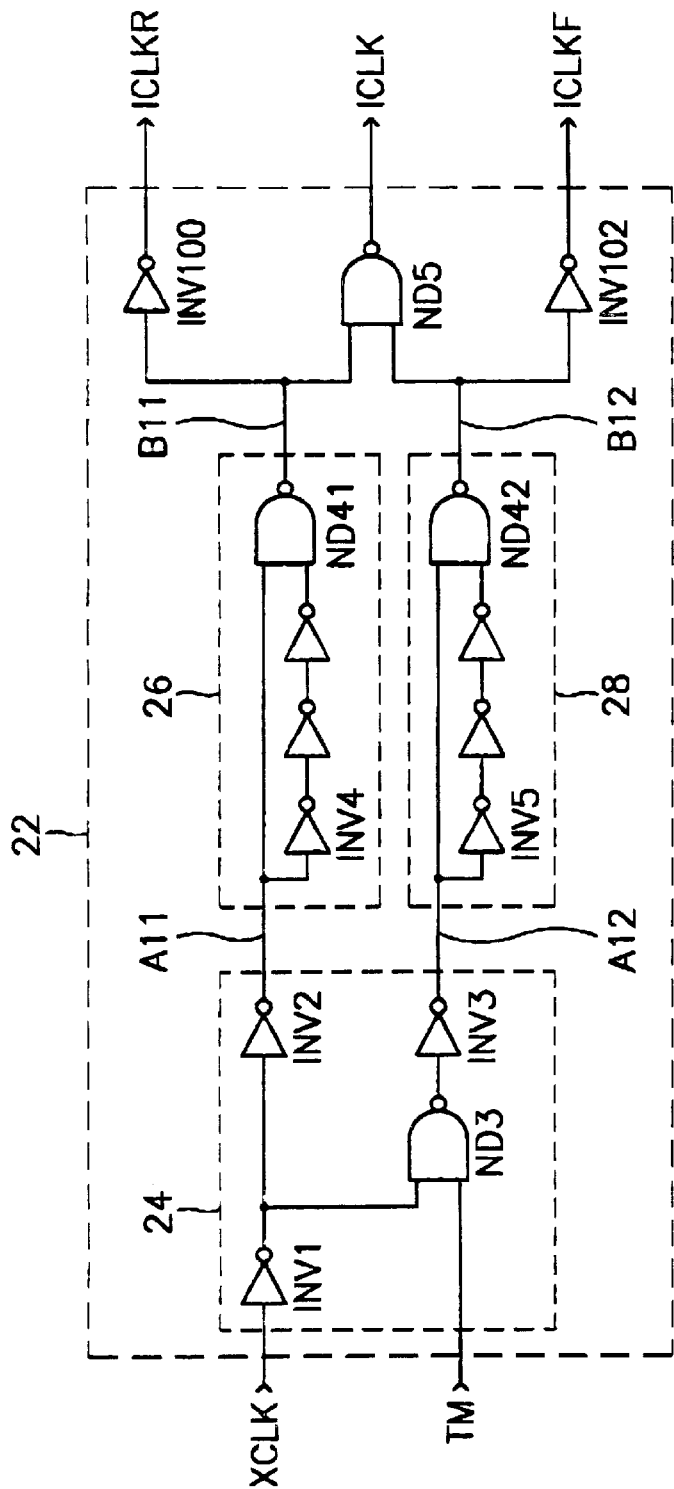
FIG. 8 is a circuit diagram illustrating a further embodiment including a frequency divider added to the embodiment of FIG. 2.

The clock generator 22 of FIG. 8 inverts the output of the clock generator 26 of FIG. 2 through an inverter INV100, and generates a rising synchronous clock signal ICLKR, which is synchronized with the external clock signal XCLK at its rising edges and has the same frequency with the external clock signal XCLK. Also, the clock generator 22 of FIG. 8 inverts the output of the clock generator 28 through an inverter INV102, and generates a falling synchronous clock signal ICLKF, which is synchronized with the external clock signal XCLK at its falling edges and has the same frequency with the external clock signal XCLK. A configuration and an operation of the embodiment in FIG. 8 about same elements of FIG. 3 will not be described. Further, when the rising synchronous clock signal ICLKR and the falling synchronous clock signal ICLKF in accordance with the embodiment of FIG. 8 are applied to the data input buffer and the data output buffer, it is evident that inverters may be modified and constructed at will in consideration of polarity of a signal to be applied thereto.

Figure 9:
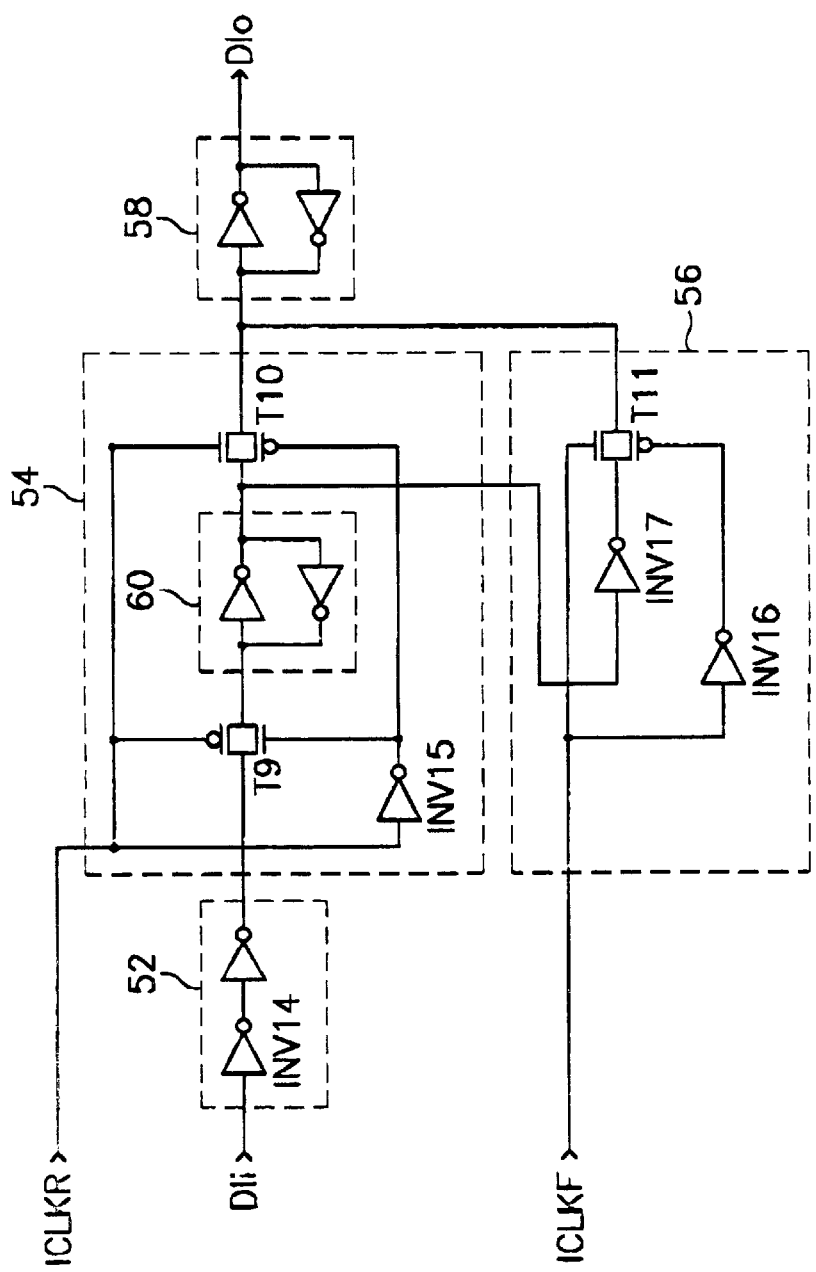
FIG. 9 is a circuit diagram illustrating an example that shows a clock signal divided by the embodiment of FIG. 8 being applied to a data input buffer.

Therefore, as shown in FIG. 9, the data input buffer can be constructed to perform a high frequency wafer level test by using the rising synchronous clock signal ICLKR and the falling synchronous clock signal ICLKF.

Referring to FIG. 9, the data input buffer includes a switching circuit 54 receiving the rising synchronous clock signal ICLKR, a switching circuit 56 receiving the falling synchronous clock signal ICLKF, a buffer 52 formed of inverters INV14 to transfer a data DIi provided from an external source to the switching circuit 54, and a latch 58 storing outputs of the switching circuits 54 and 56 and generating a data DIo therefrom.

Further, switches T9 and T10 are located in both ends of the switching circuit 54 receiving the rising synchronous clock signal ICLKR, and a latch 60 is located therebetween. The switches T9 and T10 operate in response to the rising synchronous clock signal ICLKR and a rising synchronous clock signal ICLKR inverted by an inverter INV15.

The latch 60 of the switching circuit 54 outputs a signal stored in an inverter INV17 of the switching circuit 56, resulting in providing an output of the inverter INV17 to a switch T11. The falling synchronous clock signal ICLKF and a falling synchronous clock signal ICLKF inverted by an inverter INV16 are applied to gates of the switch T11 for a switching operation.

In the case of the high frequency wafer level test mode, the data input buffer of FIG. 9, in accordance with the aforementioned configuration, allows the switching circuit 54 to switch and to output data in response to the rising synchronous clock signal ICLKR, and allows the switching circuit 56 to switch and to output data from the latch 60 of the switching circuit 54 in response to the falling synchronous clock signal ICLKF.

Figure 10:
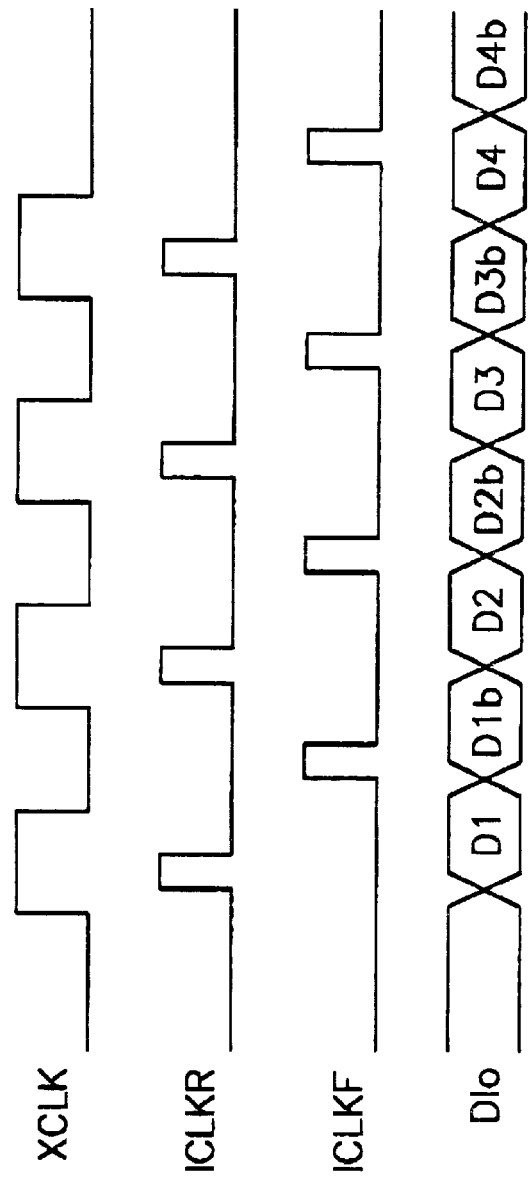
FIG. 10 is a timing diagram of signals generated in accordance with the example of FIG. 9.

By operating each switch of the switching circuits 54 and 56 at different points of time, the data DIo is switched to a high frequency signal as shown in FIG. 10 and is provided through the latch 58.

For a case of modes other than the test mode, the falling synchronous clock signal ICLKF may be constructed to open the switch T11, and thereby data is switched by only the switching circuit 54.

Figure 11:
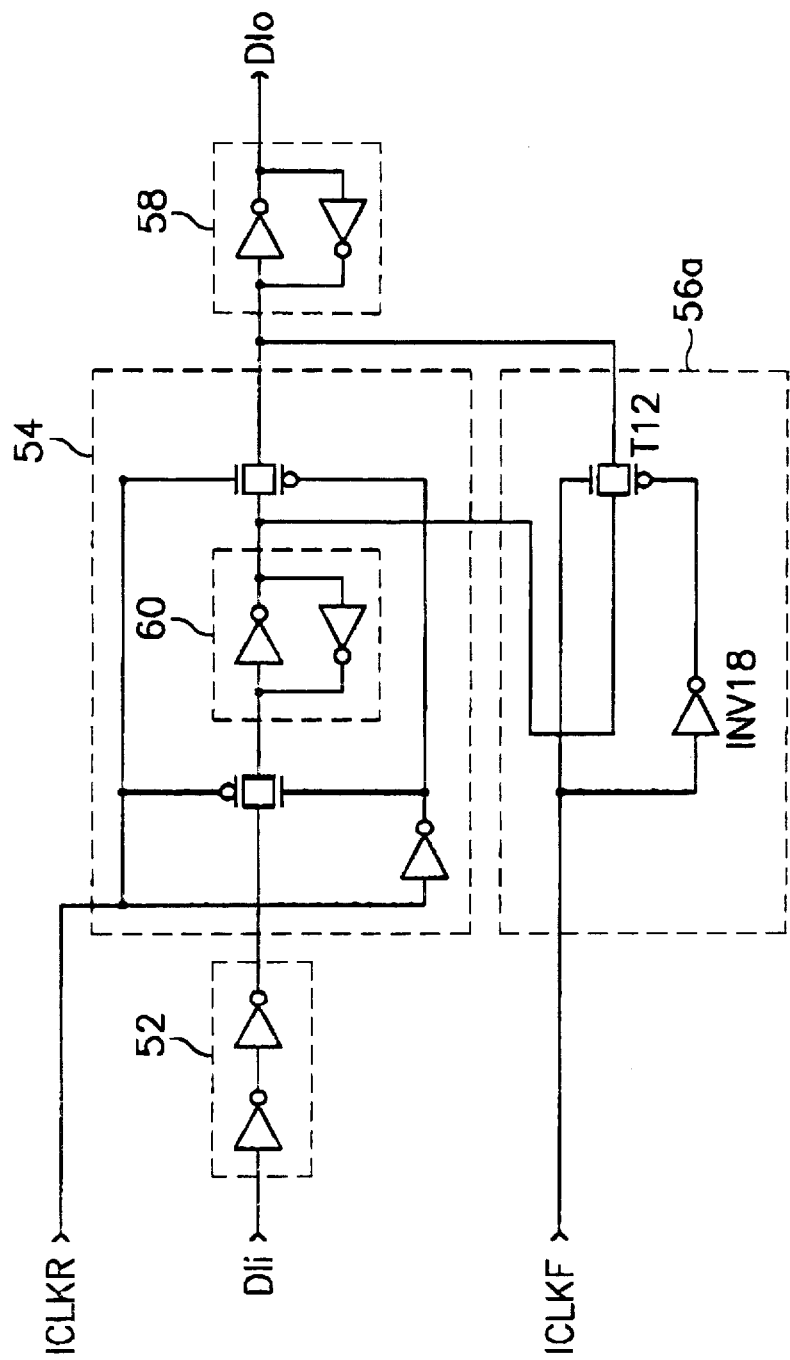
FIG. 11 is a circuit diagram illustrating a modified example that represents that of FIG. 9.

On the other hand, a switching circuit 56a as shown in FIG. 11 may be constructed not to have the inverter INV17 in the switching circuit 56 of FIG. 8, and thereby it is possible for a high frequency switching operation to be performed.

In the case of the embodiment of FIG. 9, when the input data DIi is inputted as D1, D2, D3, and D4 in synchronism with the external clock signal XCLK at its rising edges, the output data DIo becomes D1, D1b, D2, D2b, D3, D3b, D4, and D4b. On the other hand, in the case of FIG. 11, when the input data DIi is inputted as D1, D2, D3, and D4 in synchronism with the external clock signal XCLK at its rising edges, the output data DIo becomes D1, D1, D2, D2, D3, D3, D4, and D4. Here, the D1b, D2b, D3b, and D4b mean that they have negative polarities of the D1, D2, D3, and D4.

Figure 12:
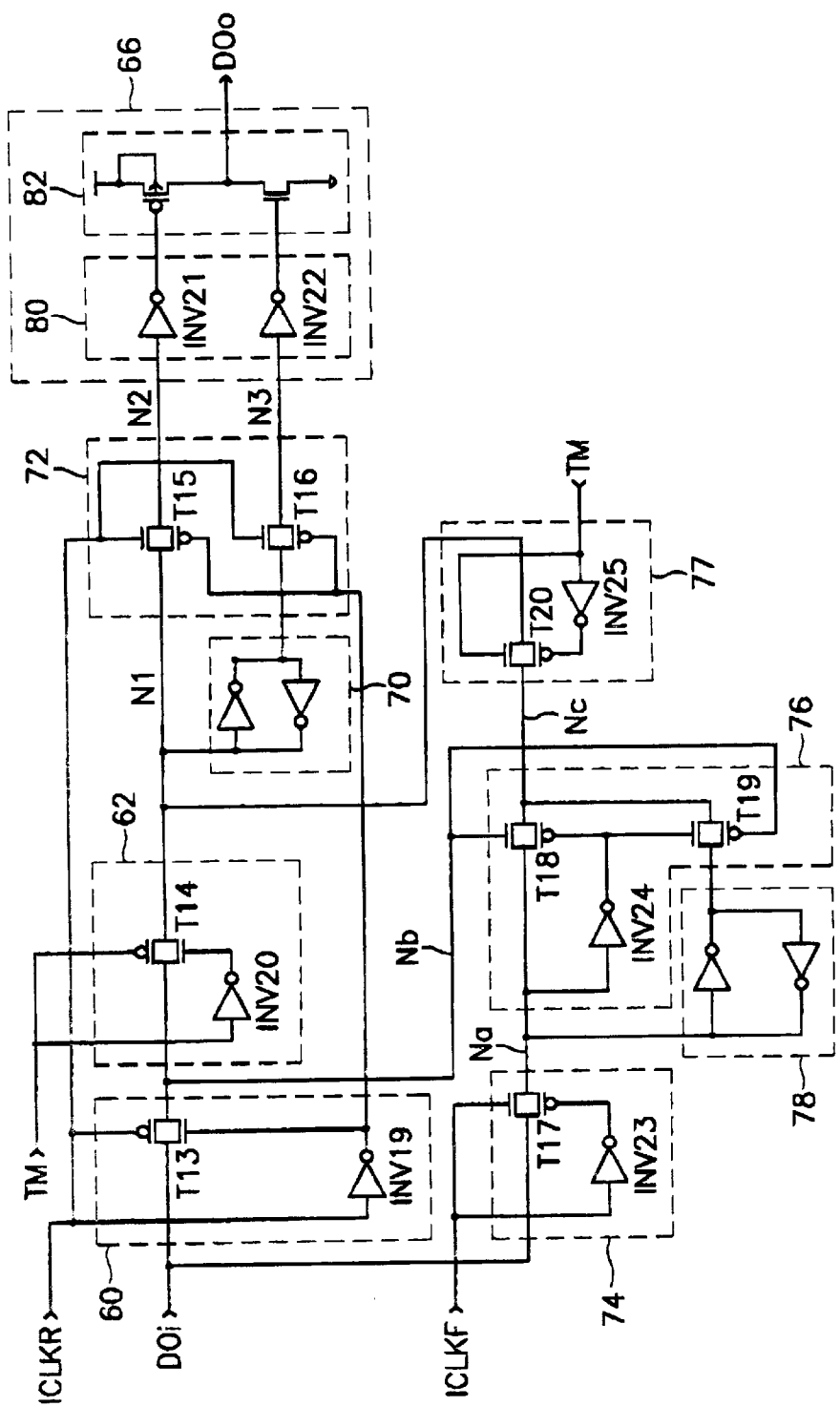
FIG. 12 is a circuit diagram illustrating an example that represents that a clock signal divided by the embodiment of FIG. 8 being applied to a data output buffer.

Meanwhile, as shown in FIG. 12, a data output buffer can be constructed to perform the high-speed wafer level test in response to the rising synchronous clock signal ICLKR and the falling synchronous clock signal ICLKF.

Referring to FIG. 12, a switching circuit 60 switches a data DOi in response to the rising synchronous clock signal ICLKR, and a gate transistor T13 of the switching circuit 60 is operable in response to the rising synchronous clock signal ICLKR and a rising synchronous clock signal ICLKR inverted by an inverter INV19.

A switching circuit 62 includes an inverter INV20 and a gate T14 to switch an output of the switching circuit 60 in response to the test mode signal TM, and a latch 70 temporarily stores an output of the switching circuit 62. An output switching circuit 72 includes gates T15 and T16 operable in response to the rising synchronous clock signal ICLKR and its inverted signal, respectively, so that the gates T15 and T16 receive and switch outputs of the switching circuit 62 and the latch 70, respectively.

A driving circuit 66 inverts and amplifies the output of the output switching circuit 72, and generates a data DOo. The driving circuit 66 includes an conversion circuit 80 formed of inverters INV21 and INV22 connected to drains of the gates T15 and T16, respectively, and output driver 82 generating the data DOo by operating an NMOS transistor and a PMOS transistor in response to an output of the conversion circuit 80.

Further, a switching circuit 74 operates in response to the falling synchronous clock signal ICLKF, and switches the data DOi. A gate T17 of the switching circuit 74 is operable in response to the falling synchronous clock signal ICLKF and a falling synchronous clock signal ICLKF inverted by an inverter INV23.

A latch 78 temporarily stores an output of the switching circuit 74, a combination circuit 76 performs an exclusive OR about data applied to an output node Na of the switching circuit 74 and data applied to an output node Nb of the switching circuit 60, and provides the result to a node Nc.

The combination circuit 76 includes a gate T18, a gate T19, and an inverter INV24. A signal of the node Nb is applied to a gate of NMOS transistor forming the gate T18 and a gate of PMOS transistor forming the gate T19, and a signal of the node Na is inverted by the inverter INV24 and is applied to a gate of PMOS transistor forming the gate T18 and a gate of NMOS transistor forming the gate T19. An output of the node Nc receiving an output of the combination circuit 76 is switched by a switching circuit 77, and is applied to a node N1. The switching circuit 77 includes a gate T20 and an inverter INV25. The gate T20 connects the node N1 and the node Nc in response to the test mode signal TM, and the TM is directly applied to a gate of NMOS transistor of the T20, and is applied to a gate of PMOS transistor of the T20 through the inverter INV25.

By such configuration, in the case of the test mode, the output of the switching circuit 77 is applied to the node N1, while in case of other modes except test mode, the output of the switching circuit 62 is applied to the node N1.

Therefore, in the case of modes other than the test mode, the data DOi is provided to the node N1 through the switching circuit 60, the data applied to the node N1 is temporarily stored to the latch 70 and is transferred to the driving circuit 66 through the switching circuit 72, and thereby the driving circuit 66 outputs the data DOo. The data DOo is switched and outputted in response to the rising synchronous clock signal ICLKR having the same frequency with that of the external clock signal XCLK.

On the other hand, in the case of the test mode, the data DOi is provided to the latch 78 in response to the falling synchronous clock signal ICLKF, a signal temporarily stored in the latch 78 is applied to the node Na, and the output of the switching circuit 60 is applied to the node Nb. As a result, the combination circuit 76 performs the exclusive OR about signals applied to the nodes Na and Nb, and outputs the result. Therefore, if the nodes Na and Nb have a same logical level, the node Nc becomes high. On the contrary, if the nodes Na and Nb have a different logical level, the node Nc becomes low. That is, if high-level signals are applied to the nodes Na and Nb, a gate T18 is turned on, so that the node Nc goes high. On the contrary, if low-level signals are applied to the nodes Na and Nb, a gate T19 is turned on, so that the node Nc goes high.

Further, if a high-level signal is applied to the node Na and a low-level signal is applied to the node Nb, the gate T18 is turned on, so that the node Nc goes low. On the contrary, if a low-level signal is applied to the node Na and a high-level signal is applied to the node Nb, the gate T19 is turned on, so that the node Nc goes low. The combination circuit 76 compresses the data DOi inputted in order of D1, D2, D3, and D4, provides D1*D2, D3*D4 therefrom, and supplies the compressed data to the node Nc.

As described above, the signal applied to the node Nc is switched in the switching circuit 77, and is temporarily stored in the latch 70. The stored signal applied to the node N1 is transferred to the driving circuit 66 in response to the rising synchronous clock signal ICLKR in the switching circuit 72 through the nodes N2 and N3. The driving circuit 66 outputs the data DOo therefrom.

Figure 13:
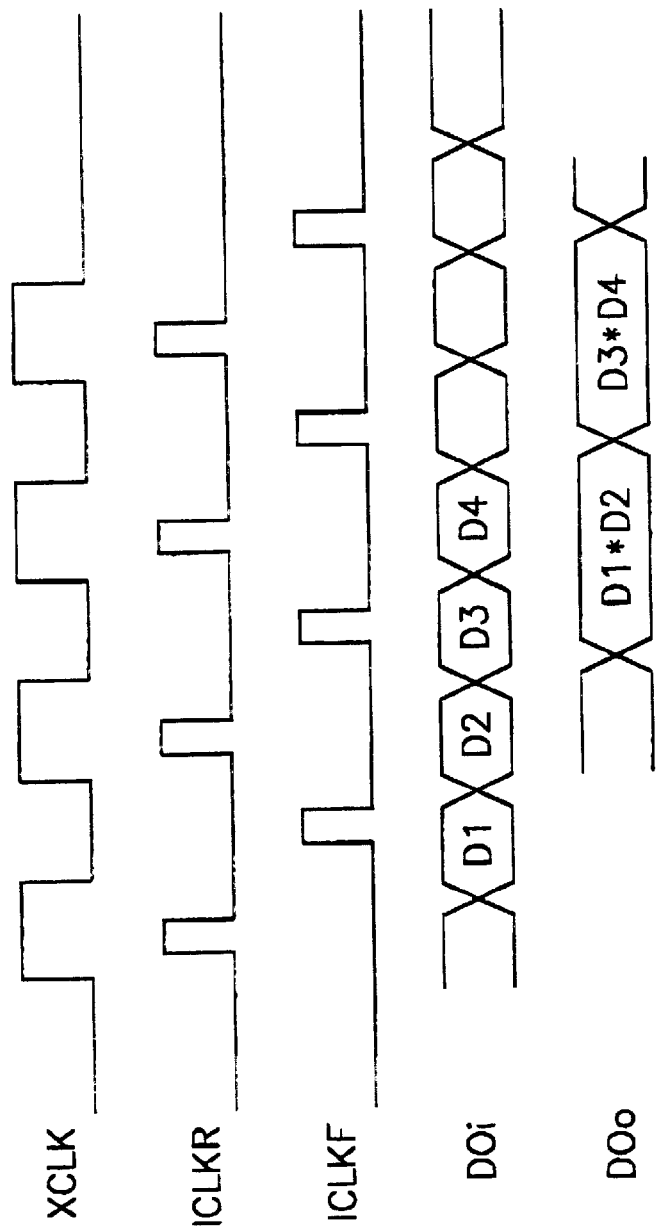
FIG. 13 is a timing diagram of signals generated in accordance with the example of FIG. 12.

As a result, in the case of the test mode as shown in FIG. 13, the data DOi is outputted as the data DOo in response to the clock signal ICLKR and ICLKF synchronized with the rising and falling edges of the external clock signal XCLK, respectively. Even though test equipment does not provide clock signals having a high frequency, errors caused by the high frequency operation can be checked in the wafer level by the configuration in accordance with the present invention. That is, even though clock signals having a frequency of 30 MHz or 60 MHz for the test operation are provided to the test equipment, it is possible for a semiconductor memory device to generate clock signals having a frequency of 60 MHz or 120 MHz in the memory device itself in the test mode. Thus, the test operation about process for command signals, addresses, or data input/output can be complexly performed in the high-speed operation circumstances. Because the high-speed wafer level test disclosed herein can be carried out with good performance, defective proportion is reduced in the high-speed test operation in the package level, resulting in improving the yield.

Further, according to the present invention, it is possible for the high-speed wafer level test to be performed without limit of circumstances of the test equipment, and thereby problems involved in the high-speed operation including the data input/output can be checked as well as whether defects on memory cells.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A semiconductor memory device for processing internal command signals, addresses, and data input/output by using an internal clock signal inverted by an external clock signal, comprising:

a first logic combination circuit receiving and combining the external clock signal and a test node signal which have different states depending on the modes of the external clock and test mode signal, the first logic combination circuit providing a non-inverted and an inverted external clock signal as a first signal and a second signal, respectively, in a test mode, and for outputting the second signal to have a predetermined level in a normal mode;

a first clock generator for generating a first clock signal synchronized with the external clock signal at its rising edges by using the first signal;

a second clock generator for generating a second clock signal synchronized with the external clock signal at its falling edges by using the second signal in the test mode, and for outputting a third signal having a predetermined level in the normal mode; and a second logic combination circuit for receiving output signals generated from the first clock generator and the second clock generator, and for generating internal clock signals corresponding to the test mode and the normal node.

2. The semiconductor memory device of claim 1, wherein the internal clock signal is synchronized with the external clock signal at its rising and falling edges in the test mode.

3. The semiconductor memory device of claim 1, wherein the first logic combination circuit comprises:

a first output circuit for generating the first signal in a non-inverted state from the external clock signal; and a second signal generator for generating an inverted signal from the external clock signal in the test mode, and for generating a predetermined-leveled signal in the normal mode.

4. The semiconductor memory device of claim 3, wherein the second signal generator comprises:

a NAND gate for receiving a test mode control signal determining the test and the normal modes and the external clock signal; and an inverter for inverting an output of the NAND gate.

5. The semiconductor memory device of claim 1, wherein the first clock generator comprises:

a first delay circuit for delaying the first signal during a predetermined time; and a third logic combination circuit for receiving outputs of the first signal and the first delay circuit, and for generating the first clock signal having a same frequency as that of the external clock signal.

6. The semiconductor memory device of claim 1, wherein the second clock generator comprises:

a second delay circuit for delaying the second signal during a predetermined time; and a fourth logic combination circuit for receiving outputs of the second signal and the second delay circuit, and for generating the second clock signal having the same frequency as that of the external clock signal.

7. The semiconductor memory device of claim 1, further comprising:
   a first output circuit for generating a signal of the first clock generator; and
   a second output circuit for generating a signal of the second clock generator, resulting in providing the first and second clock signals as internal clock signals.

8. A semiconductor memory device for processing internal command signals, addresses, and data input/output by using an internal clock signal inverted by an external clock signal, comprising:
   a first logic combination circuit receiving and combining the external clock signal and a test node signal which have different states depending on the modes of the external clock and test mode signal, the first logic combination circuit providing a non-inverted and an inverted external clock signal as a first and a second signal, respectively, in a test mode, and for generating the second signal to have a predetermined level in a normal mode;
   a first clock generator for generating a rising synchronous clock signal from a first signal synchronized with the external clock signal at its rising edges in response to the first signal;
   a second clock generator for generating a falling synchronous clock signal from a second signal synchronized with the external clock signal at its falling edges in the test mode in response to the second signal, and maintaining a predetermined level of an output in the normal mode; and
   an output circuit for generating the rising synchronous clock signal provided from the first clock generator and the falling synchronous clock signal provided from the second clock generator to perform a test operation of the data input/output.

9. The semiconductor memory device of claim 8, wherein the first logic combination circuit comprises:
   a first signal output circuit for generating a first signal in a non-inverted state from the external clock signal;
   a second signal output circuit for generating an inverted external clock signal in the test mode, and generating a predetermined-leveled signal in the normal mode.

10. The semiconductor memory device of claim 9, wherein the second signal output circuit comprises:
    a NAND gate for receiving a test mode control signal determining the test and the normal modes and the external clock signal; and
    an inverter for inverting an output of the NAND gate.

11. The semiconductor memory device of claim 8, wherein the first clock generator comprises:
    a first delay circuit for delaying the first signal during a predetermined time; and
    a second logic combination circuit for receiving outputs of the first signal and the first delay circuit, and for generating a first clock signal having a same frequency as that of the external clock signal.

12. The semiconductor memory device of claim 8, wherein the second clock generator comprises:
    a second delay circuit for delaying the second signal; and
    a third logic combination circuit for receiving outputs of the second signal and the second delay circuit, and for generating a second clock signal having a same frequency as that of the external clock signal.

13. The semiconductor memory device of claim 8, wherein the rising synchronous clock signal and the falling synchronous clock signal are provided to a data input buffer for performing the data input, wherein the data input buffer comprises:
    a first switch circuit for switching an input data temporarily stored in response to the rising synchronous clock signal;
    a second switch circuit for switching the data temporarily stored in the first switch circuit in response to the falling synchronous clock signal; and
    a first latch circuit for receiving the data generated from the first switch circuit and the second switch circuit, for temporarily storing the data, and for outputting the stored data.

14. The semiconductor memory device of claim 13, wherein the first switch circuit comprises:
    a first switching circuit for switching the data in response to the rising synchronous clock signal;
    a latch for storing temporarily data switched and outputted from the first switching circuit; and
    a second switching circuit for switching the data stored in the latch in response to the rising synchronous clock signal.

15. The semiconductor memory device of claim 14, wherein the second switch circuit comprises:
    an input circuit for receiving the data temporarily stored in the latch; and
    a third switch circuit for performing a switch operation, and for selectively providing the data of the input circuit to the first latch circuit.

16. The semiconductor memory device of claim 15, wherein the input circuit transfers the data of the latch to the third switching circuit without inversion.

17. The semiconductor memory device of claim 8, wherein the rising synchronous clock signal and the falling synchronous clock signal are provided to a data output buffer to output the data, wherein the data output buffer comprises:
    a third switch circuit for switching a data to be provided in response to the rising synchronous clock signal;
    a fourth switch circuit for switching a data to be provided in response to the falling synchronous clock signal;
    a logic circuit for performing an exclusive OR about outputs of the third and fourth switch circuits;
    a fifth switch circuit for transferring the output of the third switch circuit in the normal mode;
    a sixth switch circuit for transferring an output of the logic circuit in the test mode;
    a third latch for receiving outputs of the fifth switching circuit and the sixth switch circuit through a common mode, and for temporarily storing the outputs; and
    a second output circuit for providing a signal stored temporarily in the common node and the third latch.

18. The semiconductor memory device of claim 17, wherein the logic circuit comprises:
    a fourth latch for temporarily storing an output of the fourth switch circuit;
    a combination circuit for performing an exclusive AND about the output of the fourth switch circuit and the data in the latch, and the output of the third switching circuit.

* * * * *